(12) United States Patent
Rieubon et al.

(10) Patent No.: US 7,145,366 B2
(45) Date of Patent: Dec. 5, 2006

(54) ELECTRONIC CIRCUIT WITH A DIFFERENTIAL PAIR OF TRANSISTORS AND LOGIC GATE COMPRISING SUCH A CIRCUIT

(75) Inventors: Sébastien Rieubon, Moirans (FR); Serge Ramet, Grenoble (FR); Philippe Level, Saint-Egreve (FR)

(73) Assignee: STMicroelectronics S.A., Montrouge (FR)

( * ) Notice: Subject to any disclaimer, the term of this patent is extended or adjusted under 35 U.S.C. 154(b) by 91 days.

(21) Appl. No.: 10/954,619

(22) Filed: Sep. 30, 2004

(65) Prior Publication Data

US 2005/0258871 A1 Nov. 24, 2005

(30) Foreign Application Priority Data

Oct. 2, 2003 (FR) .................................. 03 11531

(51) Int. Cl.
*H03K 19/086* (2006.01)
*H03K 19/20* (2006.01)

(52) U.S. Cl. .................. 326/126; 326/91; 327/65; 327/563

(58) Field of Classification Search ................ 326/126
See application file for complete search history.

(56) References Cited

U.S. PATENT DOCUMENTS

| | | | |
|---|---|---|---|
| 4,999,519 A * | 3/1991 | Kitsukawa et al. | 326/110 |
| 5,381,057 A | 1/1995 | Kuroda | |
| 5,485,110 A | 1/1996 | Jones | |
| 5,627,483 A | 5/1997 | Bernard | |
| 6,552,577 B1 * | 4/2003 | Tam | 326/126 |
| 6,693,463 B1 * | 2/2004 | Mateman | 326/127 |
| 6,822,520 B1 | 11/2004 | Ramet | |

OTHER PUBLICATIONS

Preliminary French Search Report, FR 03 11531, dated Mar. 10, 2004.

* cited by examiner

*Primary Examiner*—Vibol Tan
(74) *Attorney, Agent, or Firm*—Jenkens & Gilchrist, P.C.

(57) ABSTRACT

An electronic circuit includes at least one differential pair of transistors, a control transistor switch, a first current source and a second current source. The second current source is connected to a common emitter node of the pair of transistors in order to accelerate the discharge of parasitic capacitances during a switching operation.

26 Claims, 2 Drawing Sheets

ELECTRONIC CIRCUIT WITH A DIFFERENTIAL PAIR OF TRANSISTORS AND LOGIC GATE COMPRISING SUCH A CIRCUIT

PRIORITY CLAIM

The present application claims priority from French Application for Patent No. 03 11531 filed Oct. 2, 2003, the disclosure of which is hereby incorporated by reference.

BACKGROUND OF THE INVENTION

1. Technical Field of the Invention

The present invention relates to the field of electronic circuits comprising transistors configured in differential pairs. Such configurations, comprising bipolar or MOS transistors, are often used in radiofrequency applications owing to their low sensitivity to interference, to their speed and to their limited interference effect on the power supply and the substrate in the case of integrated circuits.

2. Description of Related Art

It will be recalled here that an npn-type bipolar transistor having an n-doped collector, a p-doped base and an n-doped emitter, operates in the following manner. When the transistor is in unsaturated conducting mode, in other words currents can flow and the potential at the collector is higher than at the base, the potential at the base being itself higher than at the emitter, then the current $I_e$ in the emitter is equal to the sum of the current $I_c$ in the collector and the current $I_b$ in the base, and: $I_c = I_s (\exp(V_{be}/V_t) - 1)$ with $I_s$ the saturation current and $V_t$ a voltage of about 25 mV. To a first order, the transistor behaves like a switch that is controlled by its base voltage. Thus, $I_c = \beta I_b$, where $\beta$ is the current gain of the transistor, of the order of 100.

Therefore, a flaw in this switch is the existence of the current $I_b$ in the control signal which is absorbed by the base. Another flaw is that the potential on the emitter depends on the base potential and on the emitter current $I_e$. The variation of this potential follows a logarithmic curve. The difference in potential between a low and a high current will be about 200 mV.

Now, if the potential at the collector is lower than at the base, the transistor is in saturation mode. In this condition, the above relations are no longer valid. The transistor then accumulates electrical charges in the manner of a capacitor. When it returns to the unsaturated conducting mode, a non-negligible time is required to remove these charges which causes a delay in the switching.

The transistor is considered to be in the off-state when the voltage $V_{be}$ is zero. When returning to conducting mode, it requires a certain time to turn it on, which introduces a delay.

A need accordingly exists to provide a solution to the shortcomings explained above.

SUMMARY OF THE INVENTION

An embodiment of the invention is a differential-type transistor configuration with low power consumption and fast transistor turn-on.

According to one aspect of the invention, the electronic circuit is of the type comprising at least one differential pair of transistors, another transistor, a current source, and another current source connected to the node common to the emitters of the pair of transistors for accelerating the charge from the parasitic capacitances of the transistors during a switching operation.

According to one aspect of the invention, the electronic circuit is of the type comprising at least one differential pair of transistors, a current source, a transistor functioning as a switch and another current source. The emitter currents of the differential pair are made up of two components: for the one part, the current from the source connected to the node common to the emitters of the differential pair, and for the other, the current flowing through the switch. The current flowing through the switch is that of the other source when the switch is conducting.

Thus, the turn-on time of the transistor can be virtually eliminated and the discharge time of the parasitic capacitances greatly reduced. The speed of operation of the circuit is increased, while the total power consumption is reduced. The variations in signal propagation time are greatly attenuated.

Advantageously, the current from the source connected to the node common to the emitters of the differential pair is proportional to that of the other source.

In one embodiment of the invention, the current from the source is lower than the current from the other source. The current from the source can be in the range between 5% and 25% of the current from the other source.

In one embodiment of the invention, the circuit comprises a control of the first pair of transistors capable of delivering inverted signals.

In one embodiment of the invention, the circuit comprises two differential pairs of transistors, the pairs being superimposed such that the node common to the emitters of the first pair of transistors is connected to the collector of a transistor of the second pair and that the collector of a transistor of the first pair is connected to the collector of the other transistor of the second pair, the current source being connected to the node common to the emitters of the second pair of transistors.

In one embodiment of the invention, the circuit comprises a control of the second pair of transistors capable of delivering inverted signals.

In one embodiment of the invention, the circuit comprises an impedance placed between a power supply line and the collector of the transistor of the first pair connected to the collector of the other transistor of the second pair.

In one embodiment of the invention, the circuit comprises an impedance placed between a power supply line and the collector of the transistor of the first pair not connected to the collector of the other transistor of the second pair.

The circuit will advantageously be implemented using integrated circuit technology.

According to one aspect of the invention, the logic gate comprises an electronic circuit having at least one differential pair of transistors, another transistor, a current source and another current source connected to the node common to the emitters of the pair of transistors for accelerating the discharge of parasitic capacitance during a switching operation, the common node being connected to the collector of the other transistor.

The transistors may either be of the bipolar type or of the MOS type. Such a logic gate may advantageously be incorporated into a phase-locked loop or also into a radiofrequency system of a mobile telephone.

BRIEF DESCRIPTION OF THE DRAWINGS

A more complete understanding of the method and apparatus of the present invention may be acquired by reference to the following Detailed Description when taken in conjunction with the accompanying Drawings wherein.

DETAILED DESCRIPTION OF THE DRAWINGS

Figure 1:
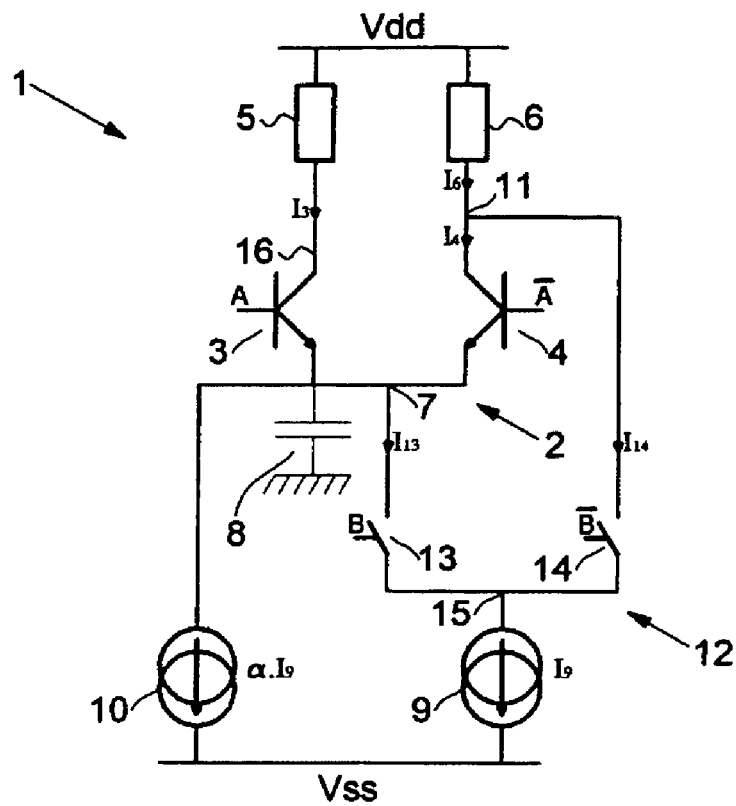
FIG. 1 is a circuit diagram of an electronic circuit according to one aspect of the invention.

As can be seen in FIG. 1, the electronic circuit 1, generally implemented in the form of an integrated circuit, is powered by a first supply voltage Vdd and a second supply voltage Vss. In the embodiment shown, the voltage Vss is ground potential (0 Volts) and the voltage Vdd is a positive voltage with respect to ground.

The circuit 1 comprises a differential pair 2 consisting of two bipolar transistors 3 and 4 configured in common emitter mode and controlled at their respective bases by the complementary signals A and A(bar). An impedance 5 of value $Z_5$ is placed between the collector of the transistor 3 and the power supply at voltage Vdd. Similarly, an impedance 6 of value $Z_6$ is placed between the collector of the transistor 4 and the power supply at voltage Vdd. The node common to the emitters of the transistors 3 and 4 is labeled 7. By reason of the structure of the transistors and the imperfections of the circuit, a parasitic capacitance 8 exists between the node 7 and ground.

Furthermore, the circuit 1 comprises two current sources 9 and 10 whose internal structure can be implemented in the conventional manner and is not given in further detail here. Reference may be made to the document FR-A-2 849 123 where exemplary implementations of current sources, notably in the form of a current mirror, may be found.

The current source 9 is connected, at the one end, to the node 15, and at the other, to the power supply at voltage Vss. The current source 10 is connected, at the one end, to the node 7, and at the other, to the power supply at voltage Vss.

The circuit also comprises a second differential pair 12 provided with a switch 13 and a switch 14, representing a pair of ideal transistors controlled by the complementary control signals B and B(bar). A node 15 is common to the switches 13 and 14 and to the current source 9. The other side of the switch 13 is connected to the node 7 and the other side of the switch 14 is connected to the node 11. The node common to the impedance 5 and to the collector of the transistor 3 has the reference 16. The current flowing through the switch 13 is denoted $I_{13}$, the current flowing through the switch 14 is denoted $I_{14}$, the current flowing through the transistor 3 is denoted $I_3$, the current flowing through the transistor 4 is denoted $I_4$ and the current flowing through the impedance 6 is denoted $I_6$. Lastly, the voltages at the nodes 7, 11 and 16 are denoted $V_7$, $V_{11}$ and $V_{16}$, respectively.

Figure 2:
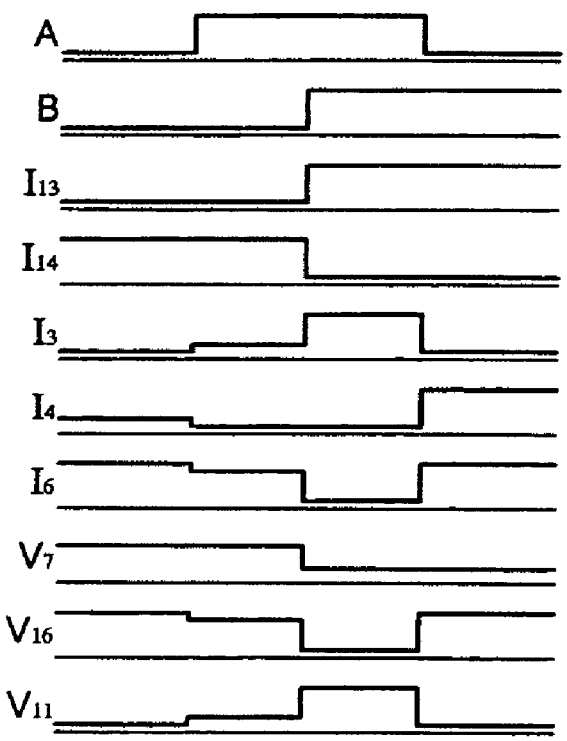
FIG. 2 is an operational timing diagram for the circuit in FIG. 1.

The timing diagram illustrated in FIG. 2 is obtained in the operation of the circuit 1. The circuit has two input signals, A and B, and two output signals, $V_{16}$ and $V_{11}$. The signal B feeds the switches 13 and 14 which will conduct the current $I_9$ from the current source 9 through the transistor 13 if the signal B is high and through the transistor 14 if the signal B is low. When the signal B is low, then $I_{13}=0$. The signal A feeds the differential pair 2. If $I_{13}$ is zero, then the transistors 3 and 4 are in the off-state. When the signals A and B are high, the current $I_3$ is equal to the sum of the current $I_9$ from the current source 9 and the current from the current source 10, denoted $\alpha I_9$ and established as being a certain percentage of the current $I_9$, for example 10%. The impedance 5 with the current $I_3$ flowing through it causes a voltage drop and the output signal $V_{16}$ is then low. The other output signal $V_{11}$ is high. The high level at the output is equal to the supply voltage Vdd. The low level equals $V_{dd}-Z_5(I_9+\alpha I_9)$, i.e., a few hundred millivolts below the high level.

The node 7 can theoretically take three different levels. The first two levels occur when the current $I_3$ is zero. The node 7 will normally follow the potential of $V_{16}$ or $V_{11}$ depending on the state of the signal A. However, transistors exhibit both forward and reverse leakage currents, which means that there is always a residual voltage between the base and the emitter of a transistor. The node 7 could therefore take a long time to reach its point of equilibrium equal to the supply voltage Vdd reduced by the residual base-emitter voltage. Therefore, when the signal B switches to the high state, the potential at the node 7 could depend on the time during which the signal B was low. However, the role of the current source 10 is to extract current from the node 7 to avoid this phenomenon. The third state occurs when the current $I_{13}$ is non-zero. Here, the potential at the node 7 is equal to $Vdd-V_{be}$ with $V_{be}$ being the base-emitter voltage of the conducting transistor of the pair 2 which is about 600 mV.

When the signal A is high and when the signal B switches from the low to the high state, the current $I_{13}$ will go from 0 to $I_9$, whereas the current $I_{14}$, equal to $I_6$, will go from $I_9$ to 0. Before signal B switches, $I_3$ is equal to $\alpha I_9$, the transistor 3 being already biased into conducting mode. The transistor 3 can therefore deliver a current $I_3$, equal to $I_9+\alpha I_9$, extremely quickly. The presence of the current source 10 allows the voltage at the node 7 to be controlled. Owing to the presence of the capacitance 8, after signal B has switched to the high state, a part of the current $I_{13}$ might be used for turning on the transistor 3 and for discharging the capacitance 8. The discharge time of the capacitance 8 depends on the initial potential of the node 7 which could introduce a variable delay into the switching of the current $I_3$ and of the voltage $V_{16}$. Accordingly, by continuously drawing a current from the node 7, the current source 10 allows the transistor 3 to be held in the off-state. The same is true for the transistor 4 during the next switching operation.

Preferably, a coefficient $\alpha$ with a low value will be chosen so that the variation in the high state of the voltage $V_{16}$, depending on the state of the signal A, will be small. Indeed, if the current $I_{13}$ is zero, the current $I_3$ can be zero or equal to $\alpha I_9$ depending, respectively, on whether the signal A is low or high. Thanks to the current $\alpha I_9$, the potential of the node 7 is equal to the supply voltage Vdd reduced by the base-emitter voltage $V_{be}$ of the transistor of the pair 2 held in the on-state and does not depend on the length of time that the signal B is held low. Since the base-emitter voltage of a transistor in the on-state varies as a function of the logarithm of the current, the said base-emitter voltage changes little when the current $I_3$, or respectively $I_4$, switches from $\alpha I_9$ to $(\alpha+1)I_9$. Since this difference is small, only a small amount of charge is needed to change the voltage across the terminals of the parasitic capacitance 8.

In other words, when the signals A and B are low, the transistor 4 and the switch 14 are conducting and the transistor 3 and the switch 13 are off. The currents $I_3$ and $I_{13}$ are therefore equal to the leakage currents. The current $I_{14}$ is equal to the current $I_9$, the current $I_4$ is equal to $\alpha I_9$ to which is added the leakage current of the switch 13. The current $I_6$ is approximately equal to $(\alpha+1)I_9$ and the output voltage $V_{16}$ is high. The output voltage $V_{11}$ is low owing to the voltage drop caused by the current $I_6$ flowing in the impedance 6. The voltage at node 7 is fairly high owing to the low value of the current $I_4$ that is of the same order as the current $\alpha I_9$.

When the signal A is high and the signal B is low, the currents $I_{13}$ and $I_{14}$ are modified with respect to the previous case. The transistor 3 is biased into an unsaturated conducting mode with a current $I_3$ equal to $\alpha I_9$, to which can be added the leakage current of the switch 13. Since the transistor 4 is blocked, the current $I_4$ is equal to the leakage current of the said transistor 4. The current $I_6$ is approximately equal to $I_9$. The voltage at the node 7 remains relatively high. The output voltage $V_{16}$ falls very slightly owing to a current $I_3$, increased by $\alpha I_9$, flowing in the impedance 5, whereas the voltage $V_{11}$, still in the low state, increases very slightly because of the reduction in the current $I_6$ by the amount $\alpha I_9$.

When the signals A and B are both high, the current $I_{13}$ is high, whereas the current $I_{14}$ is low. The current $I_3$ switches to the high state and is approximately equal to $(\alpha+1)I_9$. The current $I_4$ stays low. Since the transistor 4 and the switch 14 are in the off-state, the current $I_6$ switches to the low state. Owing to the voltage drop in the impedance 5 caused by the current $I_3$ of high value, the voltage at the node 7 switches to a low state. The output voltage $V_{16}$ also switches to a low state, whereas the voltage $V_{11}$ switches to a high state.

When the signal A switches to the low state, the signal B staying high, the current $I_3$ switches to the low state and the current $I_4$ switches to the high state. The currents $I_{13}$ and $I_{14}$ are unchanged with respect to the previous case. The current $I_6$ switches to a high state and is approximately equal to $(1+\alpha)I_9$. The voltage at the node 7 stays in a low state owing to the voltage drop caused by the current $I_6$ in the impedance 6. The voltage $V_{16}$ switches to a high state and the voltage $V_{11}$ switches to a low state.

The invention provides a circuit forming a logic gate of the NAND type. For the sake of simplicity of the drawing, the inverter provided between the bases of the transistors 3 and 4 and the inverter provided between the bases for the control of the switches 13 and 14 are not shown. The circuit according to the invention can, of course, be implemented using MOS transistors and the operation will still be identical. In order to understand the description, it suffices to replace the terms base, collector and emitter by the terms gate, drain and source.

The invention may, of course, be applied to other kinds of logic gates which can be obtained, for example, by inverting the input signals A and A(bar), B and B(bar), or by connecting the switch 14 to the node 16 instead of the node 11. Thanks to the current source 10, the propagation time of the logic gate is constant, the turn-on time of the transistor 3 or 4 is eliminated, and the discharge time of the parasitic capacitance 8 is greatly reduced. It is therefore possible for the logic gate to be operated at a higher frequency while reducing its total power consumption and greatly attenuating the variations in propagation time arising from being held in a previous logic state.

Figure 3:
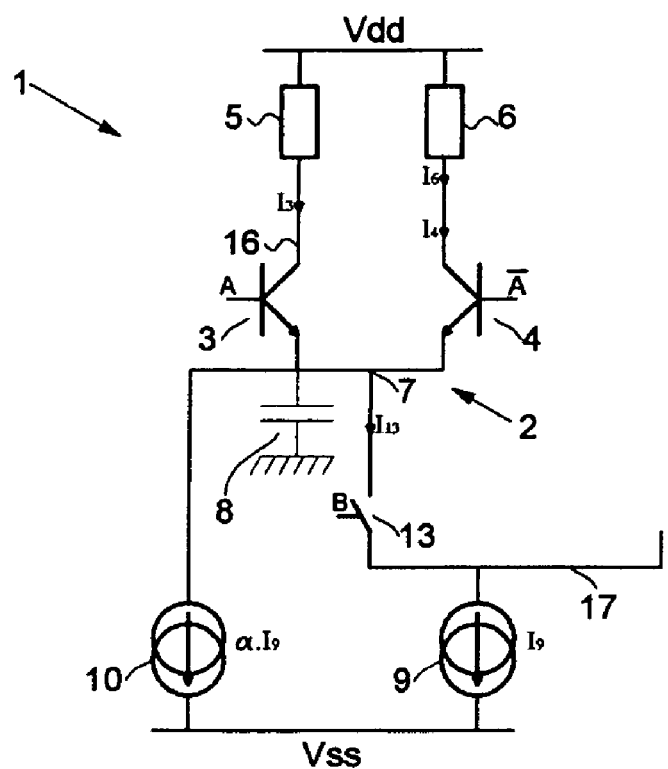
FIGS. 3 and 4 show variants of FIG. 1.

In FIG. 3, a simplified embodiment is shown in which the circuit lacks the switch 14, the current source 9 being connected to the switch 13 and to other elements not shown, by means of a conductor 17. The mode of operation can be derived from that described above.

Figure 4:
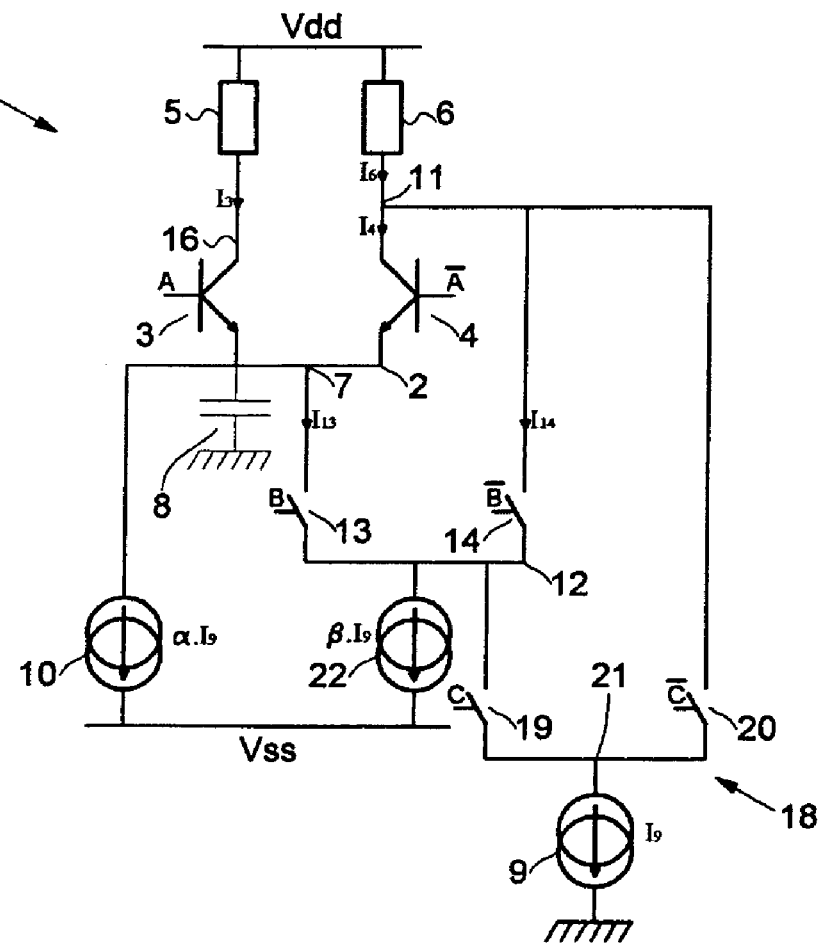

The embodiment illustrated in FIG. 4 differs from that illustrated in FIG. 1 in that a third differential stage 18 is provided. The third differential stage 18 is of a similar structure to that of the second differential stage 12. The third differential stage 18 comprises two switches 19 and 20, such as bipolar transistors or MOS transistors, configured in common emitter mode and controlled by two complementary signals C and C(bar). The switch 19 is connected to the node 15 of the second differential stage 12. The switch 20 is connected to the node 11. The node 21 common to the switches 19 and 20 is connected to the current source 9 providing current $I_9$. The node 15 of the differential pair 12 is connected to a current source 22 providing current $\beta I_9$. $\beta$ can be equal to $\alpha$ such that the currents from the current sources 10 and 22 are equal. The coefficients $\alpha$ and $\beta$ will generally be between 5 and 25%, for example in the region of 10%.

The circuit illustrated in FIG. 4 provides a logic gate having three inputs. It is possible to modify the truth table of such a logic gate by connecting the switch 20 either to the node 16 or to the node 7 in place of the connection to the node 11. Lastly, the collector of the transistor 14 can also be connected to the node 16 which will modify the truth table of the logic gate.

The current source 22 allows the transistor 13 or, respectively, the switch 14 to be biased into conducting mode depending on the level of the signal B when the signal C is low and therefore when the switch 19 is an open circuit. The current source 10 allows the transistor 3 or the transistor 4 to be biased depending on the level of the signal A when the signal B is again low and therefore when the switch 13 is an open circuit. Such circuits can be advantageously employed for forming voltage-controlled gates, generally referred to as ECL (Emitter Coupled Logic) gates, or current-controlled gates, generally called CML (Current Mode Logic) gates. These gates can be used, in particular, to form a divider in a variable-rank phase-locked loop, especially for high-frequency applications, typically from 0.9 to 20 GHz.

Although preferred embodiments of the method and apparatus of the present invention have been illustrated in the accompanying Drawings and described in the foregoing Detailed Description, it will be understood that the invention is not limited to the embodiments disclosed, but is capable of numerous rearrangements, modifications and substitutions without departing from the spirit of the invention as set forth and defined by the following claims.

What is claimed is:

1. An electronic circuit, comprising:
    a first differential pair of transistors;
    a second differential pair of transistors, wherein a first transistor of the second pair is coupled to a common emitter node of the first differential pair and a second transistor of the second pair is coupled to a collector node of one transistor of the first pair;
    a first current source connected to a common emitter node of the second differential pair of transistors;
    a second current source connected to the common emitter node of the first differential pair of transistors and generating a current which is not sunk through the first current source.

2. The circuit according to claim 1, wherein the second current source is proportional to the first current source.

3. The circuit according to claim 2, wherein the current from the second current source is lower than the current from the first current source.

4. The circuit according to claim 3, wherein the current from the second current source is in the range between 5% and 25% of the current from the first current source.

5. The circuit according to claim 1, further comprising a control of the first pair of transistors capable of delivering inverted signals.

6. An electronic circuits comprising:
    a first differential pair of transistors;
    a second differential pair of transistors, the first and second pairs being superimposed such that a common emitter node for the first pair of transistors is connected to a collector of a transistor of the second pair and that a collector of a transistor of the first pair is connected to the collector of another the transistor of the second pair;

a first current source connected to the common emitter node of the first differential pair of transistors; and a second current source connected to a common emitter node of the second differential pair of transistors, wherein a current of the first current source does not flow through the second current source.

7. The circuit according to claim 6, further comprising a control of the second pair of transistors capable of delivering inverted signals.

8. The circuit according to claim 6, further comprising an impedance mounted between a power supply line and the collector of the transistor of the first pair connected to the collector of the other transistor of the second pair.

9. The circuit according to claim 8, further comprising an impedance mounted between a power supply line and the collector of the transistor of the first pair that is not connected to the collector of the other transistor of the second pair.

10. The circuit according to claim 6, further comprising:
a third differential pair of transistors configured in common emitter mode, a collector of one of the transistors therein being connected to the common emitter node of the second pair of transistors.

11. A logic gate comprising a circuit according to claim 1.

12. A circuit, comprising:
a first differential pair of transistors connected at a first common emitter node;
a first current source connected between the first common emitter node and a first reference voltage;
a first switch connected between the first common emitter node and a first control node;
a second switch connected between a collector of one transistor in the first differential pair and the first control node; and
a second current source connected between the first control node and the first reference voltage.

13. The circuit of claim 12 wherein the first and second switches are implemented using a second differential pair of transistors connected at a second common emitter node which forms the first control node.

14. The circuit of claim 13 wherein control nodes of the transistors in the second differential pair of transistors receive complementary control signals.

15. The circuit of claim 12 further comprising a first impedance connected between a second reference voltage and the collector of one transistor in the first differential pair and a second impedance connected between the second reference voltage and a collector of another transistor in the first differential pair.

16. The circuit of claim 12 wherein control nodes of the transistors in the first differential pair of transistors receive complementary input signals and collectors of the transistors in the first differential pairs provide complementary output signals.

17. The circuit of claim 12, further comprising:
a third switch connected between the first control node and a second control node;
a fourth switch connected between a collector one transistor in the first differential pair and the second control node; and a third current source connected between the second control node and the first reference voltage.

18. The circuit of claim 12 wherein:
the first and second switches are implemented using a second differential pair of transistors connected at a second common emitter node which forms the first control node; and
the third and fourth switches are implemented using a third differential pair of transistors connected at a third common emitter node which forms the second control node.

19. A circuit, comprising:
a differential pair of transistors connected at a common emitter node;
a first current source connected between the common emitter node and a first reference voltage;
a first switch connected between the common emitter node and a control node;
a second switch connected between the control node and a collector node of one of the transistors in the differential pair; and
a second current source connected between the control node and the first reference voltage.

20. The circuit of claim 19 wherein the first switch is implemented using a transistor receiving a control signal at its control terminal.

21. The circuit of claim 19 further comprising a first impedance connected between a second reference voltage and a collector of one transistor in the differential pair and a second impedance connected between the second reference voltage and a collector of another transistor in the differential pair.

22. The circuit of claim 19 wherein control nodes of the transistors in the differential pair of transistors receive complementary input signals and collectors of the transistors in the differential pair provide complementary output signals.

23. A circuit, comprising:
a first differential pair of transistors connected at a common conduction node;
a first current source connected between the common conduction node and a first reference voltage;
a transistor switch connected between the common conduction node and a control node;
a second transistor switch connected between an other conduction node of one transistor in the differential pair and the control node; and
a second current source connected between the control node and the first reference voltage.

24. The circuit of claim 23 wherein control nodes of the transistors in the differential pair of transistors receive complementary input signals and other conduction nodes of the transistors in the differential pair provide complementary output signals.

25. The circuit of claim 23 wherein the transistors in the differential pair of transistors are bi-polar transistors.

26. The circuit of claim 23 wherein control nodes of the first and second transistor switches receive complementary control signals.

* * * * *

UNITED STATES PATENT AND TRADEMARK OFFICE
CERTIFICATE OF CORRECTION

PATENT NO.        : 7,145,366 B2
APPLICATION NO. : 10/954619
DATED             : December 5, 2006
INVENTOR(S)       : Sébastien Rieubon et al.

It is certified that error appears in the above-identified patent and that said Letters Patent is hereby corrected as shown below:

| | |
|---|---|
| Column 3, line 48 | Replace "3 is denoted 13," With --3 is denoted $I_3$-- |
| Column 6, line 63, Claim 6 | Replace "An electronic circuits comprising:" With --An electronic circuit, comprising:-- |
| Column 7, line 3, Claim 6 | Replace "of another the transistor" With --of another transistor-- |

Signed and Sealed this

Twenty-seventh Day of March, 2007

JON W. DUDAS
*Director of the United States Patent and Trademark Office*